United States Patent [19]

Natsume

[11] Patent Number: 5,635,417

[45] Date of Patent: Jun. 3, 1997

[54] METHOD OF MAKING A READ ONLY MEMORY DEVICE

[75] Inventor: Kiyoshi Natsume, Hamamatsu, Japan

[73] Assignee: Yamaha Corporation, Japan

[21] Appl. No.: 327,185

[22] Filed: Oct. 21, 1994

[30] Foreign Application Priority Data

Oct. 25, 1993 [JP] Japan ................................. 5-288750

[51] Int. Cl.$^6$ ........................................ H01L 21/265
[52] U.S. Cl. ................................ 438/130; 438/275
[58] Field of Search ............................. 437/47, 48, 52, 437/45, 40–41, 203

[56] References Cited

U.S. PATENT DOCUMENTS

| | | | |
|---|---|---|---|
| 5,214,303 | 5/1993 | Aoki | 257/390 |
| 5,298,451 | 3/1994 | Rao | 437/70 |
| 5,316,957 | 5/1994 | Spratt et al. | 437/31 |
| 5,329,148 | 7/1994 | Aoki | 257/390 |
| 5,334,547 | 8/1994 | Nakamura | 437/52 |
| 5,395,777 | 3/1995 | Yang | 437/40 |

FOREIGN PATENT DOCUMENTS

| | | |
|---|---|---|
| 62-43180 | 2/1987 | Japan . |
| 62-43181 | 2/1987 | Japan . |

OTHER PUBLICATIONS

Wolf, Stanley, Ph.D., *Silicon Processing for the VLSI ERA*, "Process Integration," vol. 2, Lattice Press, 1990, pp. 28–44.

*Primary Examiner*—Jey Tsai

[57] ABSTRACT

A NOR type masked ROM device including a multiplicity of FETs each having a channel region, an insulated gate structure formed on the channel region, and a pair of current electrode regions disposed on the both sides of the insulated gate structure, wherein trenches are selectively formed in those FETs which are programmed to be turned off, between the insulated gate structure and at least one of the associated current electrode regions, and regions of opposite conductivity type to that of the current electrode regions are formed under the trenches.

22 Claims, 11 Drawing Sheets

METHOD OF MAKING A READ ONLY MEMORY DEVICE

BACKGROUND OF THE INVENTION

1. Field of the Invention

This invention relates to a semiconductor memory, and more particularly to a semiconductor memory including insulated gate type field effect transistors (hereinafter abbreviated as FET) as memory elements.

2. Description of the Related Art

Among the semiconductor memories utilizing insulated gate type FETs as memory elements, there are known masked ROMs. Masked (or mask-programmed) ROMs are non-vola the memories into which information is permanently stored through the use of custom masks during fabrication. There are known NAND type ROMs and NOR type ROMs.

A NAND type ROM includes a series connection of a plurality of memory elements which are so made that all the memory elements can be turned on, and has an operation state where each individual memory element can be turned on or off according to the stored information and all the other memory elements are turned on. Usually, each memory element in a NAND type masked ROM determines the information "1" or "0" depending on whether the FET is depletion type or enhancement type.

A NOR type masked ROM includes a parallel connection of a plurality of memory elements. The individual memory element can be selectively driven into a read state to read out the stored information. Usually, a NOR type masked ROM determines the information "1" or "0" depending on whether the enhancement type FET has a low threshold voltage or a high threshold voltage. Sometimes, a NOR type masked ROM is called a high threshold voltage type ROM. In NOR Type masked ROM, an FET representing "0" does not become turned on in the operational state.

Figure 12:
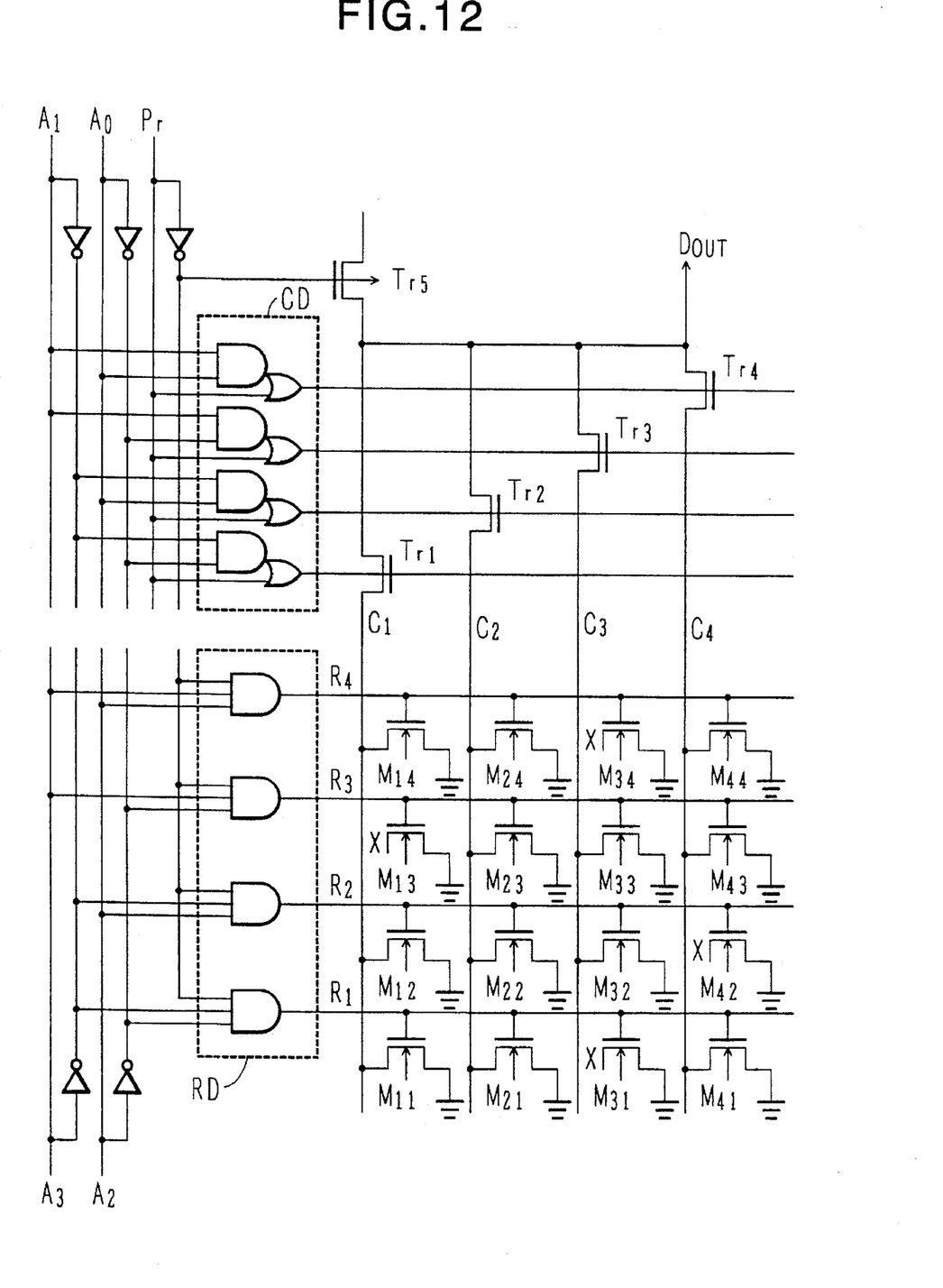
FIG. 12 is an equivalent circuit diagram of an example of a NOR type masked ROM circuit.

FIG. 12 shows an example of a NOR Type masked ROM circuit. Memory cells Mij formed of FETs are disposed in a matrix. Gate electrodes of the memory cell transistors belonging to the same row are connected to a common row line Ri, and drains of the memory cell transistors belonging to the same column are connected to a common column line Cj. The source electrode of each memory cell transistor is grounded. Each column line Cj is connected to a data out terminal $D_{OUT}$ through a transistor Tr which is controlled by a column decoder CD. The row line Ri is driven by a signal supplied from a row decoder RD.

Control signals $P,r\ A_0$–$A_3$ are decoded in column decoder CD and row decoder RD to produce addressing signals. In the figure, those memory cells which are indicated by x are disconnected from the corresponding column line Cj. That is to say, even when the gate is applied with a drive voltage, the memory cell M does not become turned on. Specifically, the threshold voltage thereof is higher than the drive voltage, so that the memory does not allow a current to flow therethrough.

Figure 13:
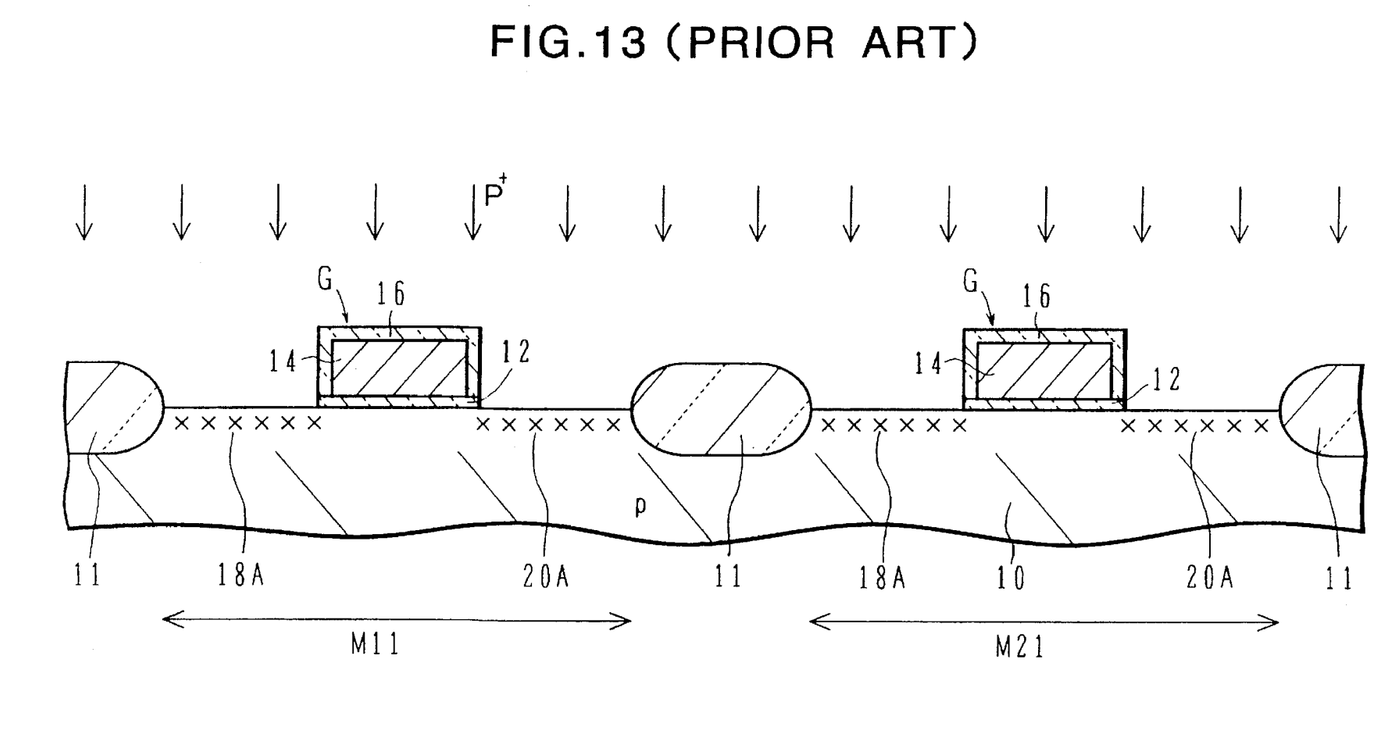
FIGS. 13 and 14 are cross sections of a semiconductor substrate for illustrating main steps of the manufacture of a semiconductor memory device according to prior art.
Figure 14:
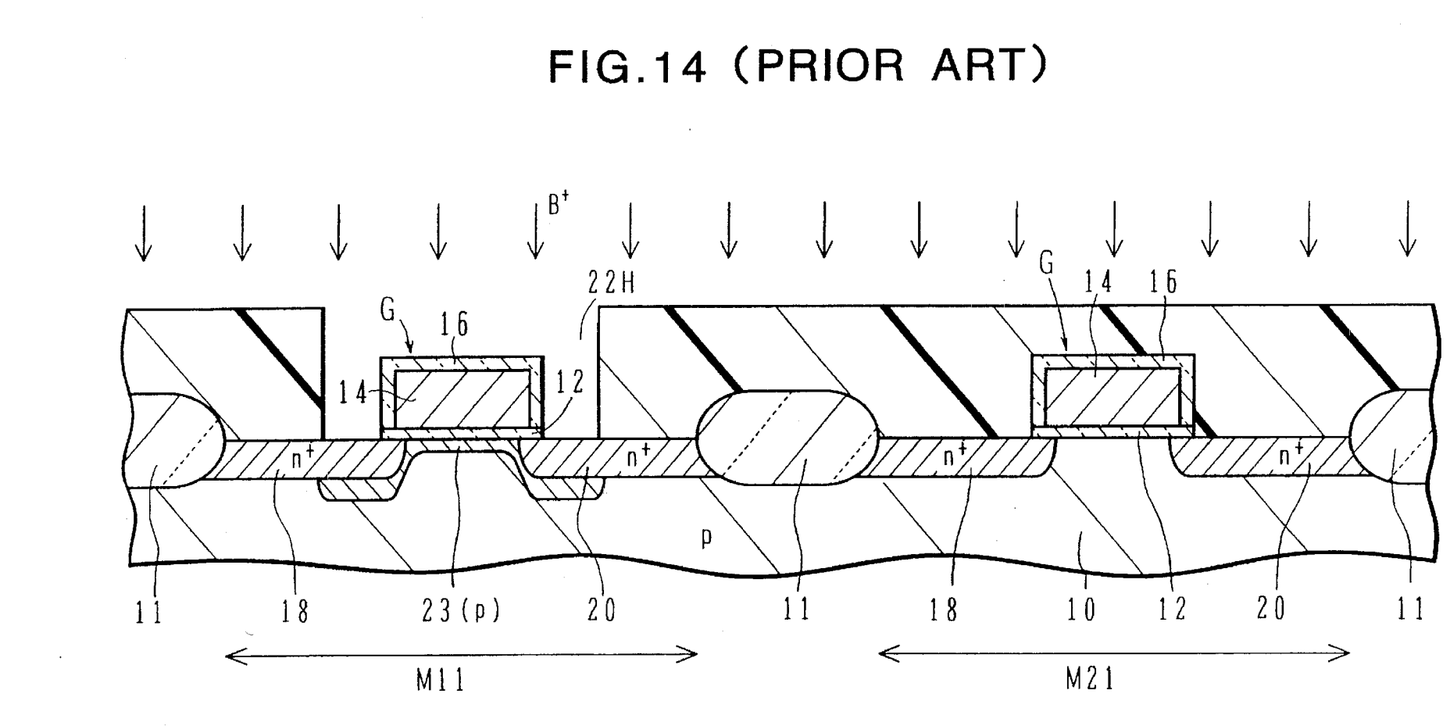

There is known such a method for manufacturing FETs of high threshold voltage in a NOR type masked ROM, as shown in FIGS. 13 and 14.

In FIG. 13, field oxide regions 11 are formed on a surface of a p-type semiconductor substrate 10 to define or surround active regions. On each active region, an insulated gate structure including a gate insulating film 12 and a gate electrode 14 is formed. Further, the surface of the gate electrode 14 is coated with an insulating film 16. For example, when the gate electrode 14 is made of polycrystalline silicon, the insulating film 16 can be made by oxidizing the surface of the gate electrode 14.

An n-type impurity ions such as $P^+$(phosphor) are implanted into the semiconductor substrate 10 utilizing the gate electrode structure 12, 14 and 16 and the field oxide 11 as a mask, to form ion implanted regions 18A and 20A between the gate electrode structure and the field oxide. The ion implanted region 18A corresponds to a source region and the other ion implanted region 20A corresponds to a drain region.

As shown in FIG. 14, a resist film 22 is coated on the substrate 10 and is patterned to have an aperture 22H by exposure and development. The resist mask 22 covers some of the FET structures and exposes gate structures and adjacent regions of some other FET structures formed on the same substrate. Then, boron ions $B^+$ are accelerated at an accelerating voltage of about 120 KeV and implanted into the substrate 10 utilizing the gate structure 12, 14 and 16 and the resist mask 22 as an implantation mask.

This ion implantation is done to increase the acceptor concentration in the channel region below the gate electrode 14, thereby to increase the threshold voltage of the transistor. At the same time, boron impurity is also doped deep outside the gate structure and inside the aperture 22H below the ion implanted regions 18A and 20A. After the resist mask 22 is removed, the substrate is subjected to heat treatment which activates the implanted impurities. Thus, $n^+$-type source and drain regions 18 and 20 and a p-type impurity doped region 23 are provided.

The "cut-off" state of an FET necessary in a NOR type masked ROM, means that no current is allowed to flow through the source-drain current path even when a power source voltage (generally 5 V) is applied to the gate in the state where a voltage of 2 to 3 V is applied between the source and the drain.

In the above-described method, impurity ions are implanted through the gate electrode to the channel region to increase the p-type impurity concentration In the region 23 so as to set the threshold voltage of the FET higher than the power source voltage.

In case where the gate electrode 14 is formed of a polycide structure (a laminate structure of a lower polycrystalline silicon layer and an upper silicide layer), the ion implantation to the channel region is apt to be non-uniform due to the non-uniformity of the grains in the silicide layer. Thus, it is not easy to secure sufficient implantation dose in the channel.

Similar situation occurs also when the gate electrode 14 is made of a single layer structure of polycrystalline silicon, although the degree of non-uniformity is reduced. Therefore, there is a possibility that FETs having imperfect turn-off state may be generated, thereby decreasing the yield.

The region 23 doped with the p-type impurity extends from the channel region to the underside of the source and drain regions. Therefore, the capacitance of the pn-junctions between the p-type region 23 and the $n^+$-type source and drain regions 18 and 20 become large to decrease the operation speed of the circuit.

SUMMARY OF THE INVENTION

An object of this invention is to provide a semiconductor memory capable of easily and steadily providing turned-off FETs without increasing the junction capacitance so much.

Another object of this invention is to provide a method for manufacturing such a semiconductor memory with a good yield.

According to an aspect of this invention, there is provided a semiconductor masked read-only memory (ROM) device comprising a plurality of field effect transistors (FETs), each having an insulated gate electrode, a source and a drain region sandwiching the gate electrode, said FETs including at least one off FET comprising: a semiconductor substrate region having a First conductivity type; a gate insulating film made of an insulator and Formed on said substrate region; a gate electrode formed on the gate insulating film; a pair of current electrode regions having a second conductivity type opposite to said first conductivity type and disposed in the substrate region to sandwich said gate electrode; at least one trench formed in the substrate region between said gate electrode and one of said current electrode regions; and a current blocking region having said first conductivity type and formed at least under said trench.

According to another aspect of this invention, there is provided a method of manufacturing a masked read-out memory (ROM) device comprising the steps of: forming field oxide region of a mesh shape on a semiconductor substrate region of a first conductivity type to surround and define a multiplicity of active regions in said substrate region; forming a plurality of insulated gate structures running across said active regions; implanting ions of an impurity of a second conductivity type opposite to said first conductivity type into said active regions utilizing said field oxide region and said insulated gate structures as an implantation mask, to form first ion-implanted regions; covering some active regions and those portions of other active regions remote from the insulated gate structures with a resist mask; etching exposed portions of said active regions utilizing said insulated gate structures and the resist mask as an etching mask, to form trenches; implanting ions of an impurity of said first conductivity type into said active regions utilizing said insulated gate structures and the resist mask as an implantation mask, to form second ion-implanted regions of the first conductivity type at bottom of said trenches; removing said resist mask; and subjecting the semiconductor substrate region to a thermal treatment to activate the implanted impurities.

According to the above-described semiconductor memory, a trench is formed across the source-drain current path, and a region having the opposite conductivity type to that of the source and drain regions are formed under the trench. Therefore, the current path between the source and drain regions is cut-off by the combination of the trench and the opposite conductivity type region.

The opposite conductivity type region extends around the trench but does not extend below the source and drain regions nor to the central part of the channel region. Therefore, the increase in the junction capacitance becomes small.

Further, there is no need to deepen the trench, nor to deepen the opposite conductivity type region, nor to implant the opposite conductivity type region through the gate electrode. In this way, an FET can be easily and steadily set in a cut-off state.

The trench and the opposite conductivity type region can be made shallow. Further, they can be manufactured in self-aligned manner to the gate electrode. Thus, the yield of manufacture can be enhanced.

It is sufficient to form such a current turning-off structure formed of a trench and an opposite conductivity type region, at least at one side of the gate electrode. The FETs can be easily and steadily turned off, while suppressing the decrease in the operation speed of the circuit.

Since the trench and the opposite conductivity type region can be formed shallow, and self-aligned with the gate electrode, yield of the manufacture can be improved.

DESCRIPTION OF THE PREFERRED
EMBODIMENTS

Description will be made on a case of making a NOR type masked ROM circuit as shown in FIG. 12. Normally operable FETs and normally turned-off FETs will be formed on a same semiconductor substrate.

Figure 1:
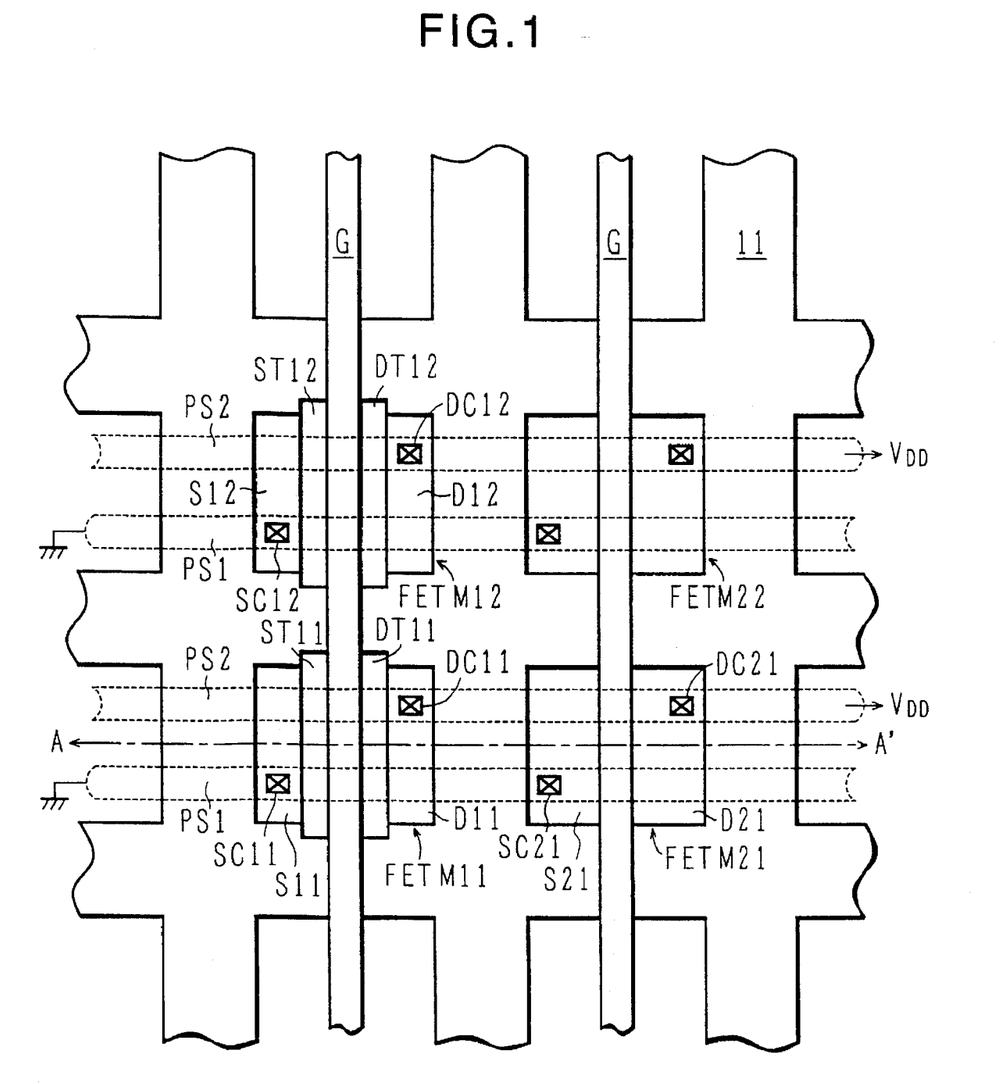
FIG. 1 is a plan view of a semiconductor memory device according to an embodiment of this invention.
Figure 2:
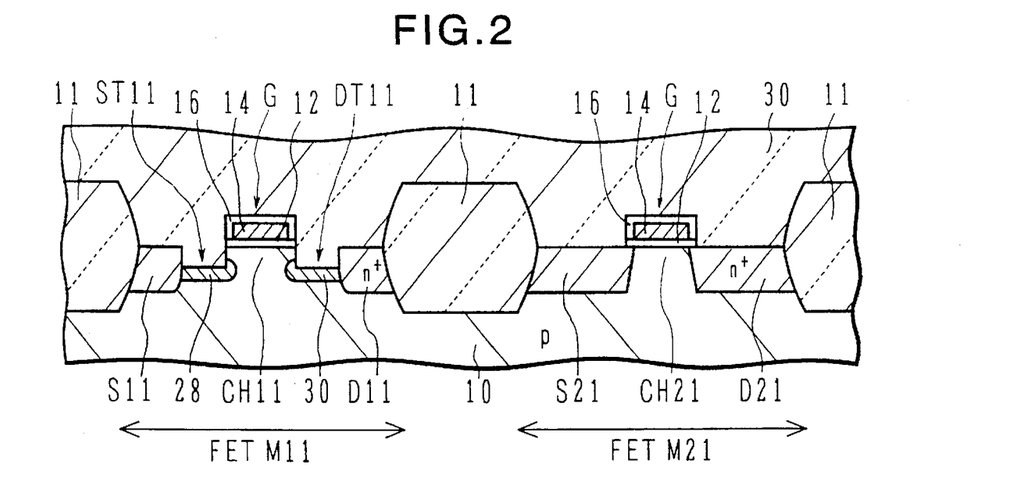
FIG. 2 is a cross section of a semiconductor memory device of FIG. 1 along line A-A'.

FIG. 1 shows a plan view of a semiconductor masked ROM device according to an embodiment of this invention. FIG. 2 shows a cross section along line A-A' in FIG. 1.

FETs M11, M12, . . . M21, M22, . . . are distributed in a matrix Form in a p-type silicon substrate. Gate electrodes G run vertically in the figure and the power source lines PS1 and PS2 run horizontally in the figure. An FET is positioned at each cross point of the gate line G and the pair of power source lines PS1 and PS2. An FET M11, for example, comprises a source region S11 and a drain region D11 disposed on the both sides of the associated gate electrode G. There are formed depressions or trenches ST11 and DT11 between the gate electrode G and the source and drain regions S11 and D11. As shown in FIG. 2, at least the bottom of these trenches ST11 and DT11 are doped with p-type impurity, while the source and drain regions S11 and D11 are doped with n-type impurity. As shown in FIG. 1, the source region S11 makes contact with the power source line PS1 (ground potential) at a contact region SC11, and the drain region D11 makes a contact with the other power source line PS2 ($V_{DD}$) at a contact region DC11.

In FET M21, a source region S21 and a drain region D21 are disposed on the both side of the gate electrode G without intervening the source trench ST nor the drain trench DT. The source region S21 makes contact with the power source line PS1 at a contact region SC21, and the drain region D21 makes a contact with the other power source line PS2 at a drain contact region DC21.

As shown in FIG. 2, the source region S11 and the drain region D11 of the FET M11 are separated from the channel region CH11 by the trenches ST11 and DT11 and the p-type regions 28 and 30. The source region S21 and the drain region D21 of the FET M21 touches the channel region CH21 below the gate electrode G.

When the gate electrodes G are applied with a certain voltage above the threshold voltage, the FET M11 is not always turned on because of the existence of the source and drain trenches ST11 and DT11 and the p-type doped regions 28 and 30 below these trenches. The FET M21 is turned on as an usual FET which is applied with a gate voltage above the threshold voltage.

An FET M12 has a similar structure as the FET M11 and is always turned off. An FET M22 has a similar structure as the FET M21 and is turned on when a gate voltage above the threshold voltage is applied.

FIGS. 3 to 6 show main steps of a method for manufacturing a semiconductor masked ROM device as shown in FIGS. 1 and 2.

Figure 3:
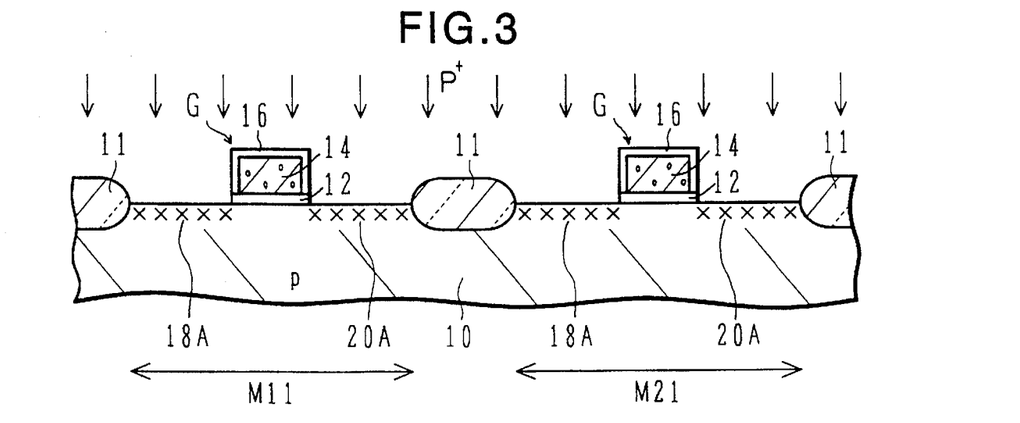
FIGS. 3 to 6 are cross sections of a semiconductor substrate for illustrating main steps in the manufacture of a semiconductor memory device as shown in FIGS. 1 and 2 according to another embodiment of this invention.

In FIG. 3, on a surface of a p-type silicon substrate 10, field oxide regions 11 are formed by the conventional LOCOS process to define and surround active regions. Then, a gate insulating film 12 made of silicon oxide is formed on the surface of the active regions by thermal oxidation. On the gate insulating film 12, a gate electrode layer 14 made of polycrystalline silicon is formed by chemical vapor deposition (CVD). The gate electrode layer 14 is doped in-situ or by ion implantation. The gate electrode layer 14 and the underlying gate insulating film 12 are patterned by lithography, and the surface of the gate electrode layer 14 is thermally oxidized to form an insulating film 16 made of silicon oxide.

Then, utilizing the gate electrode G formed of a laminate of the insulating film 12, the gate electrode layer 14 and the insulating film 16 and the field oxide film 11 as an implantation mask, an n-type impurity such as $P^+$ or $As^+$ is implanted selectively to the surface of the semiconductor substrate 10 at an accelerating energy of 5 to 60 KeV and a dose of $1\times10^{15}$ to $2\times10^{16}$ cm$^{-2}$ to form impurity implanted regions 18A and 20A for forming the n-type source regions and the n-type drain regions. In the figure, the lefthand part corresponds to FET M11 and the righthand part corresponds to FET M21.

Figure 4:
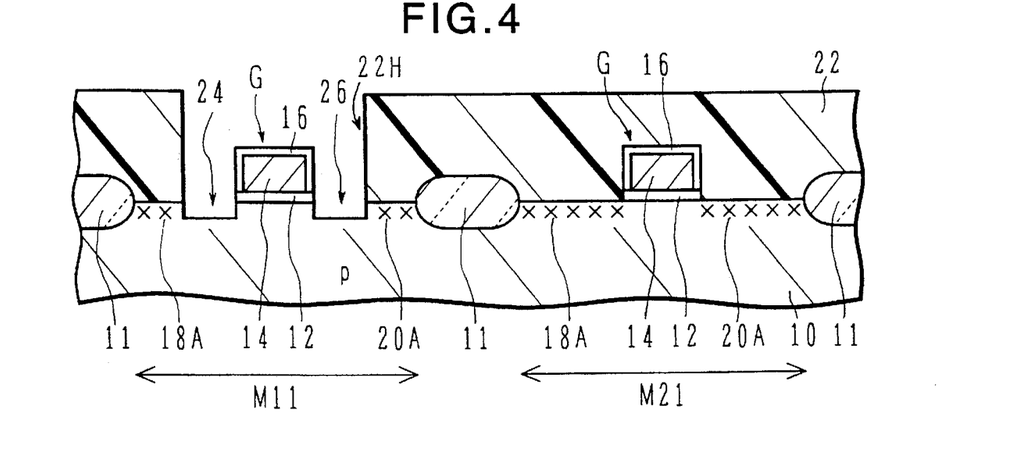

As shown in FIG. 4, a resist layer 22 is coated on the substrate surface, exposed and developed to form an aperture 22H which exposes the gate electrode G and the parts of ion implanted regions 18A and 20A adjacent to the gate electrode G in the FET M11. The aperture 22H is formed to run transverse to the direction of current flow in the transistor active region and extend to the field oxide. Then, the substrate surface is selectively etched using the gate electrode laminate including the insulating film 12, the gate electrode layer 14 and the insulating film 16, and the resist film 22 as an etching mask to cut off trenches 24 and 26 in the substrate surface on the both sides of the gate electrode G in correspondence to the aperture 22H. The cut-off trenches 24 and 26 are formed for cutting-off the current path between the source and the drain by removing the ion-implanted regions 18A and 20A, and has a depth of the order of 100 nm, for example. Here, it is to be noted that the FET M21 is completely covered by the resist film 22 so that there is formed no trench in FET M21.

The etching process is preferably performed by dry etching using $SF_6/Cl_2$ as an etchant gas, but may also be performed by wet etching using $HF/HNO_3$ as an etchant liquid.

Figure 5:
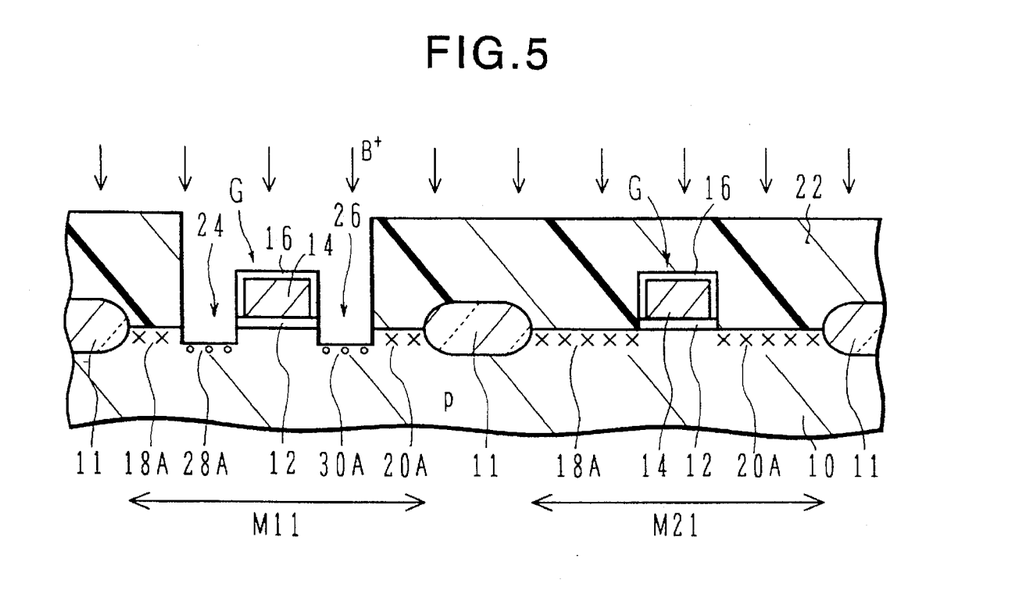

As shown in FIG. 5, utilizing the same resist mask 22 and the gate electrode laminate G as an implantation mask, boron ions $B^+$ are selectively implanted to the substrate surface, to form ion implanted regions 28A and 30A at the bottom surface of the cut-off trenches 24 and 26 in the substrate. The boron implantation is performed, for example, at an accelerating energy of 20 KeV and at a dose of about $1\times10^{13}$ atoms/cm$^2$. Here, $BF_2$ ions may be implanted in place of boron B. The resist mask 22 is removed thereafter.

Figure 6:
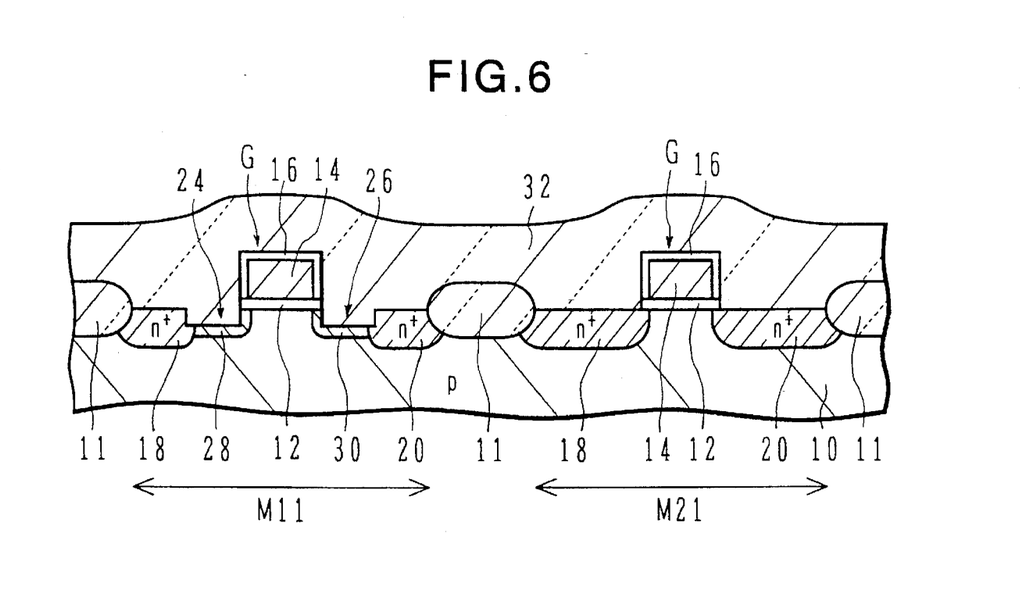

As shown in FIG. 6, an interlayer insulating film 32 is deposited by CVD on the whole surface of the substrate.

The interlayer insulating film is made of for example, a phospho-silicate glass (PSG) film, a boron phosphosilicate glass (BPSG) film, a low pressure CVD oxide film, or the like. The PSG film is formed by atmospheric pressure CVD at a substrate temperature of about 400° C. by using source gases of $SiH_4$, $O_2$ and $PH_3$. The BPSG film is formed by atmospheric pressure CVD at a substrate temperature of about 400° C. by using source gases of $SiH_4$, $O_2$, $PH_3$ and $B_2H_6$. The low pressure CVD (LP-CVD) oxide film is also formed by LP-CVD at a substrate temperature of about 700° C. by using source gases of tetraetyloxysilane (TEOS) and oxygen gas.

Also, the interlayer insulating film may be formed of non-dope silicate glass (NSG) or spin-on-glass (SOG).

Then, heat treatment is performed to activate the implanted impurities, so as to form $n^+$-type source regions 18, $n^+$-type drain regions 20, and p-type cut-off regions 28 and 30, and thereby p-m junctions are formed. Thus, an FET M11 having a field effect transistor structure with cut-off trenches 24 and 26 and the opposite conductivity type regions 28 and 30 between the gate and source/drain regions 18 and 20 and other FET M21 of the conventional structure are simultaneously formed. The FETs may be enhancement type field effect transistors.

It is apparent from FIGS. 6 and 14 that the area of pn-junction between the source/drain regions and the additionally formed opposite conductivity type region(s) has much decreased from the case of FIG. 14 to the case of FIG. 6.

In the structure of FIG. 6, since no ion implantation is done to the channel region below the gate electrode G, each FET has a threshold voltage of about 1 V, common to the cut-off FET and non-cut-off FET. Therefore, when a power source voltage of about 5 V is applied to the gate electrode G, all the channel regions are inverted from p-type to n-type. But, in FET M11, p-type cut-off regions 28 and 30 are formed under the cut-off trenches 24 and 26 between the gate electrode G and the source/drain regions 18 and 20. Therefore, the current path between the source and the drain includes $n^{30}$ -p-n-p-$n^+$ structure, and hence is cut-off. No current is allowed to flow in the path between the source and the drain. Therefore, "cut-off" state of the FET required for the NOR type masked ROM device is provided.

The p-type impurity concentration in the cut-off regions 28 and 30 is preferably as low as possible, since a high impurity concentration will lead to decrease in a brakedown voltage and also increases the capacitance of the $n^+p$ junction. Further, the p-type cut-off regions 28 and 30 are formed for cutting-off the channel. If they are formed deep and separated from the substrate surface, the intended purpose can not be achieved and a leak current may be allowed to flow. Therefore, it is important that the p-type cut-off regions 28 and 30 are formed shallow. The depth of the cut-off regions 28 and 30 is determined preferably not to allow any substantial n-type region to appear in the trench bottom surface after the final thermal treatment. For example, the depth of the cut-off regions 28 and 30 is selected to 100 nm or less.

Figure 7:
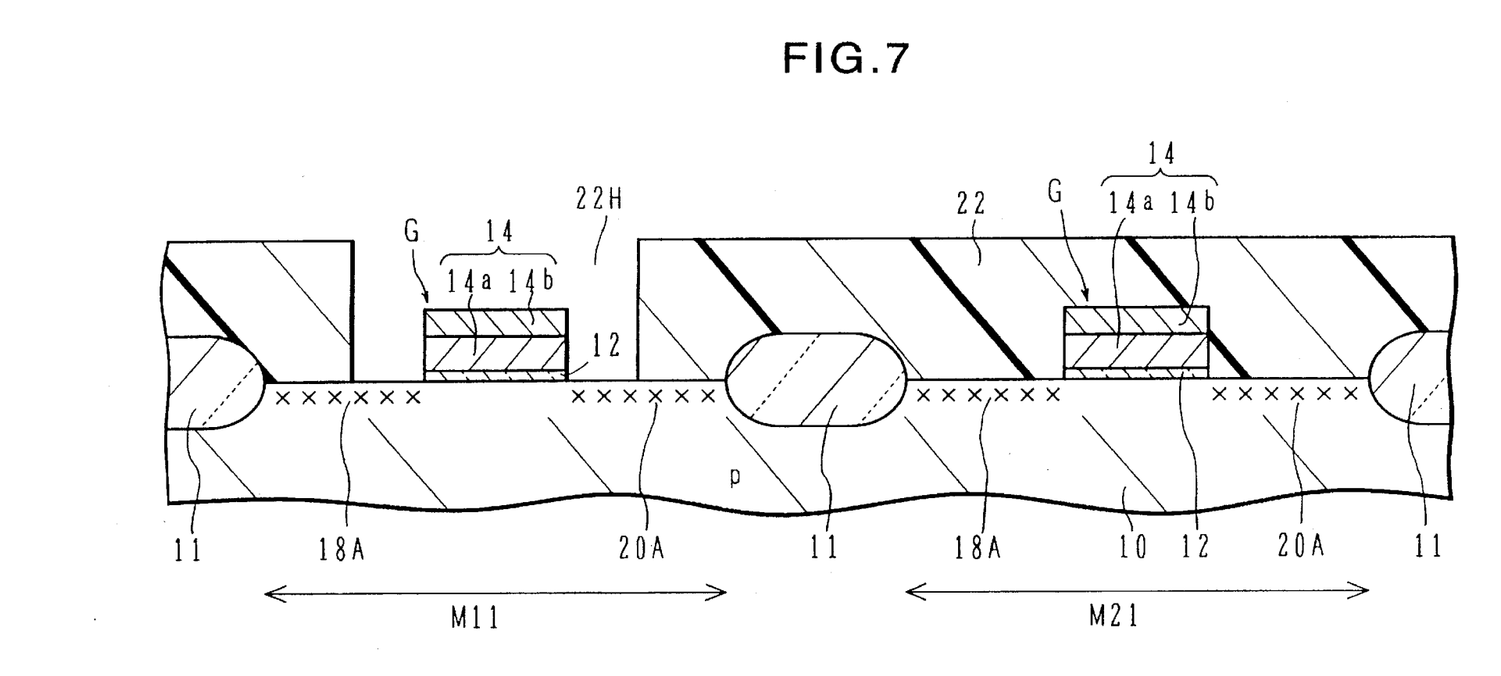
FIGS. 7 and 8 are cross sections of a semiconductor substrate for illustrating main steps of the manufacture of a semiconductor memory device according to another embodiment of this invention.
Figure 8:
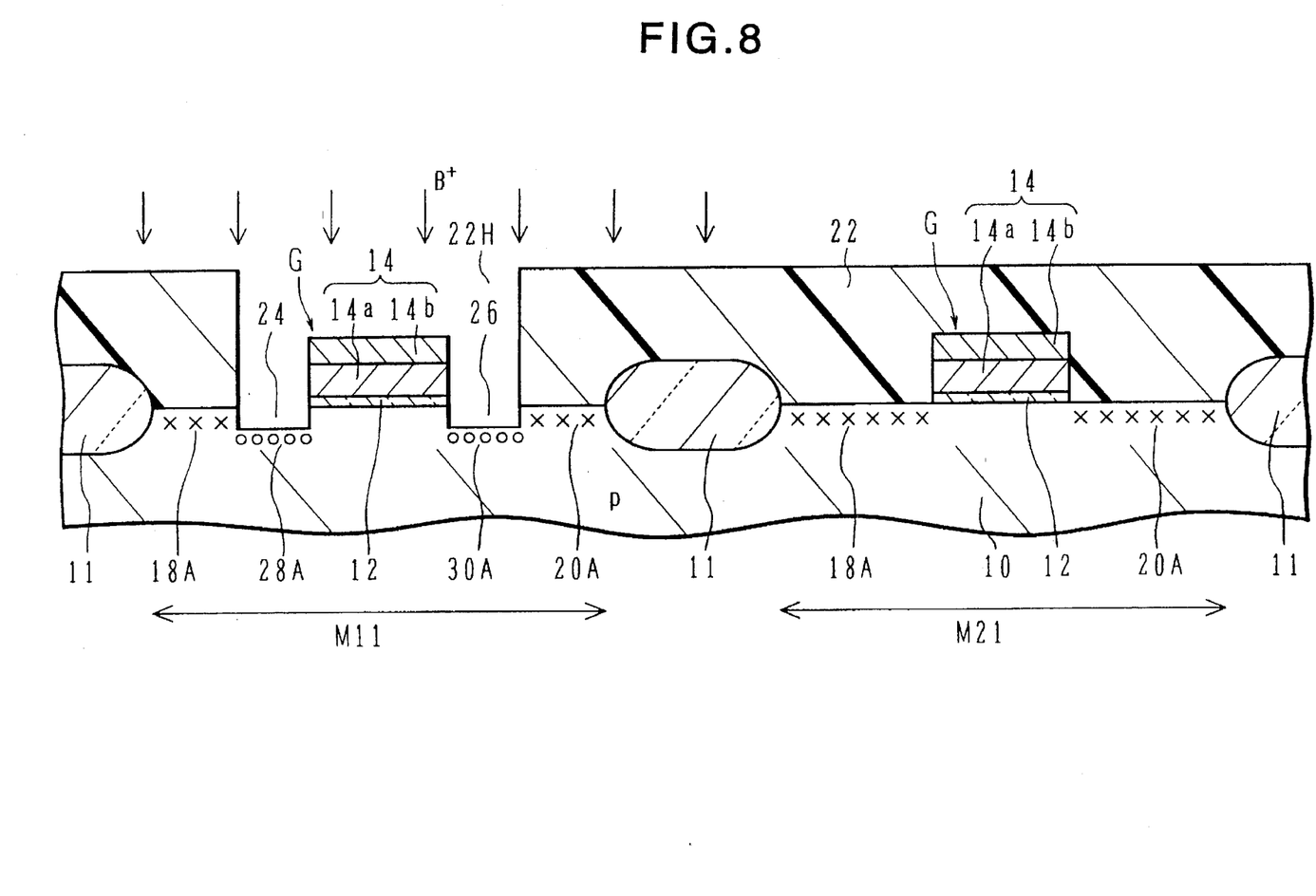

FIGS. 7 and 8 show manufacturing processes for making a semiconductor masked ROM device according to another embodiment of this invention. Similar parts as those in FIGS. 3 to 6 are denoted with similar reference numerals and the description thereof is omitted. In this embodiment, the gate electrode layer 14 is formed of a polycide which is a laminate of a lower polycrystalline silicon layer 14a and an upper silicide layer 14b. The silicide may be $WSi_2$, but is not limited thereto. The insulating Film 16 as shown in FIG. 3 is dispensed with in this embodiment.

In FIG. 7, a gate electrode is formed by depositing a polycrystalline silicon layer 14a and a silicide layer 14b on a gate insulating film 12, and patterning these layers.

Then, ion implantation is selectively performed utilizing the gate electrode layer 14 and the gate insulating film 12 and the field oxide regions 11 as an implantation mask to Form ion implanted regions 18A and 20A. Then, similar to the case of FIG. 4, a resist pattern 22 having an aperture 22H is Formed on the upper surface of the substrate. The FET M21 is perfectly covered by the resist pattern 22.

In FIG. 8, selective etching of the substrate surface is done only to the FET M11, utilizing the gate electrode layer 14, the gate insulating film 12 and the resist layer 22 as an etching mask to form cut-off trenches 24 and 26. Then, $B^+$ ions are selectively implanted into the substrate surface utilizing the same mask as that of the etching step to form ion-implanted regions 28A and 30A at the bottom surface of the cut-off trenches 24 and 26.

Then, the resist mask 22 is removed. Thermal treatment is performed similar to the case of FIG. 6, to provide $n^+$-type source and drain regions 18 and 20 and p-type cut-off regions 28 and 30 as shown in FIG. 6.

Figure 9:
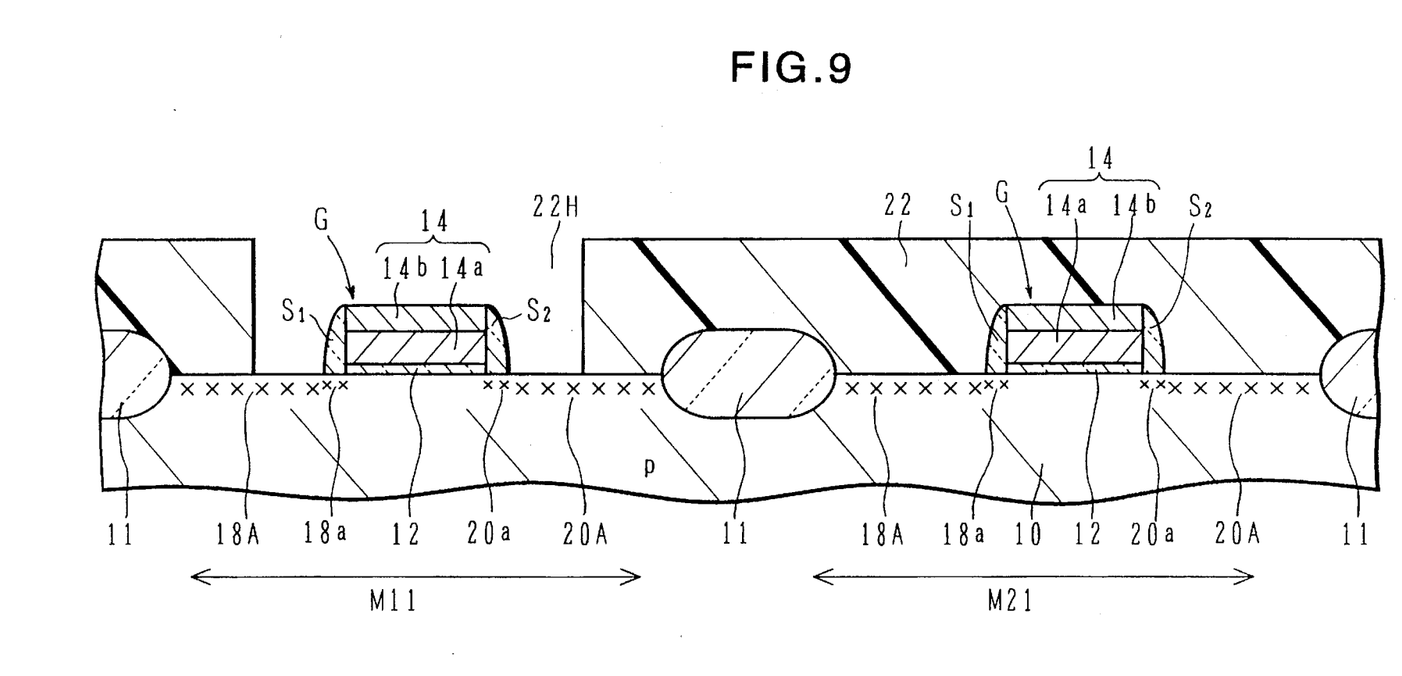
FIGS. 9 to 11 are cross sections of a semiconductor substrate for illustrating main steps of the manufacture of a semiconductor memory device according to another embodiment of this invention.
Figure 10:
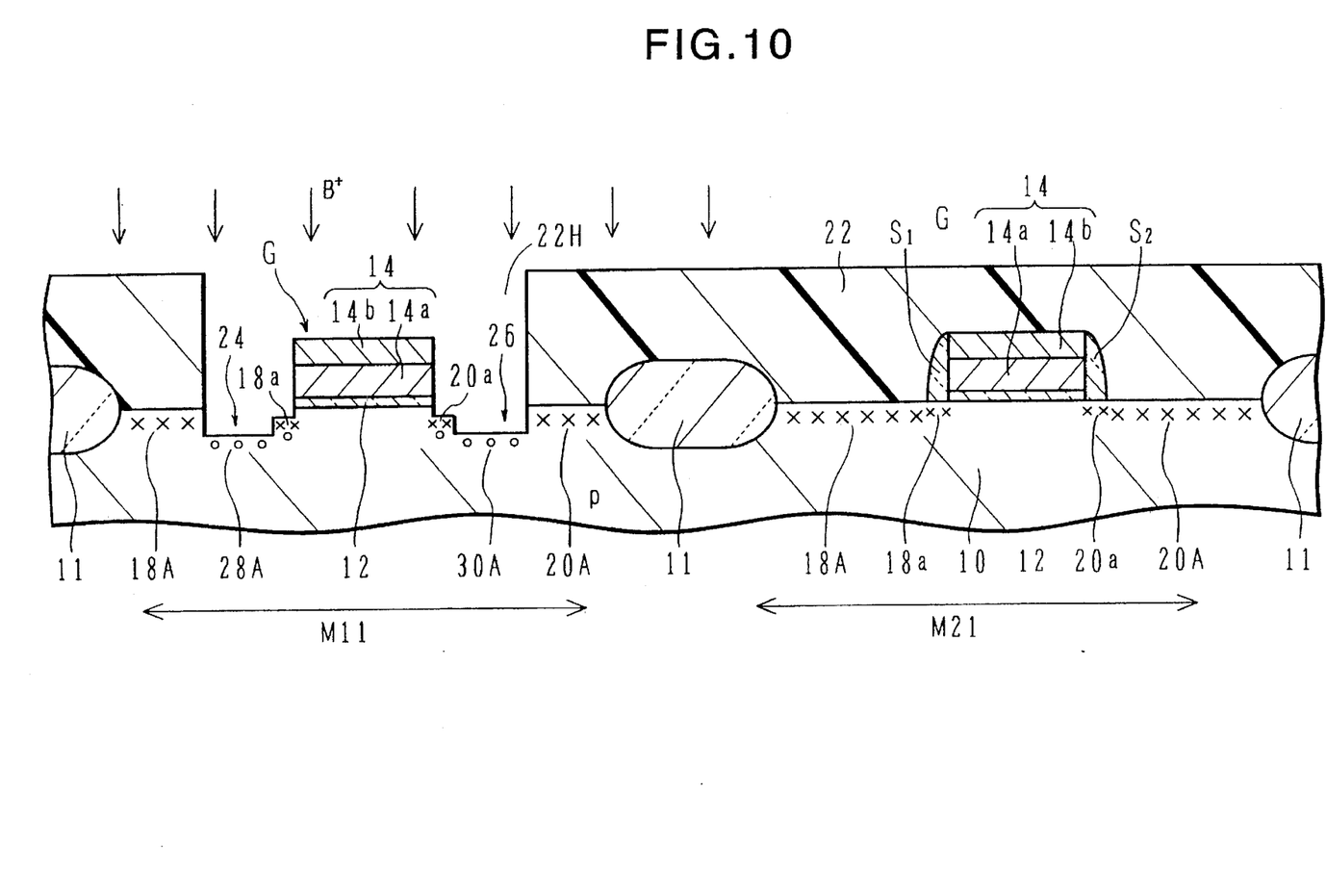
Figure 11:
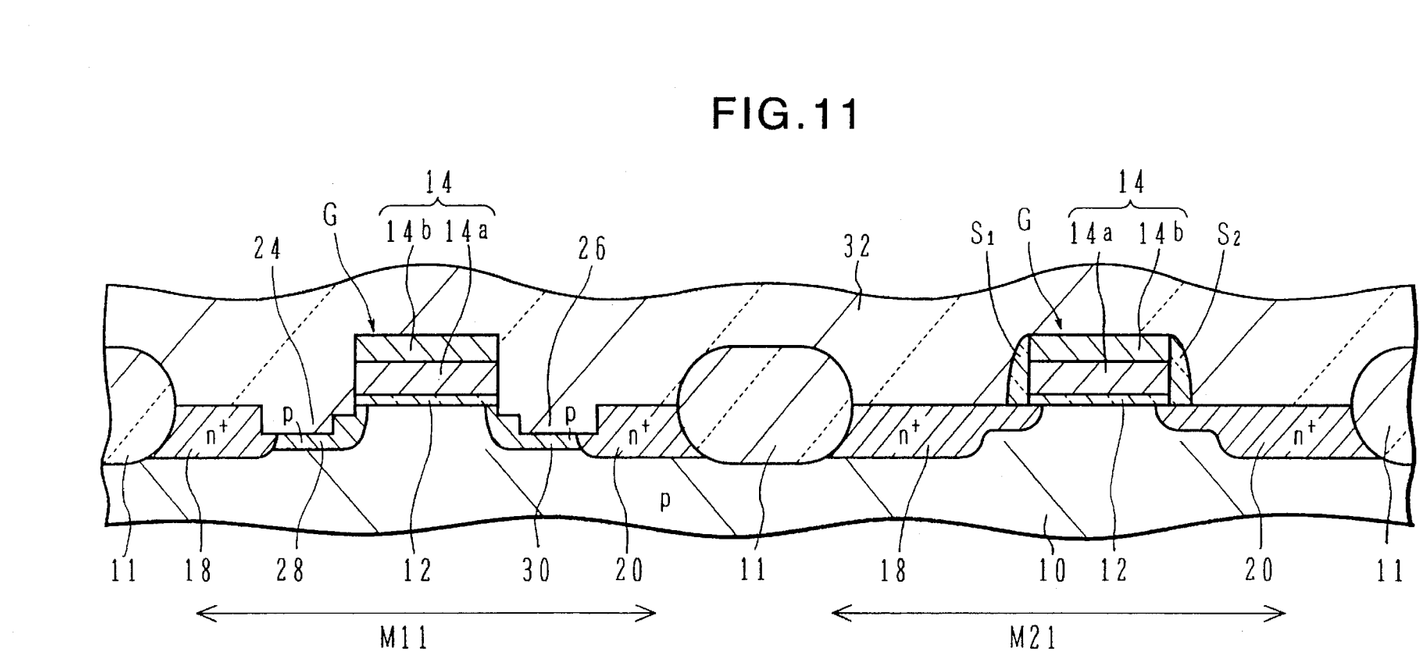

FIGS. 9 to 11 show steps of the process for making a semiconductor masked ROM device according to another embodiment of this invention. Similar parts to those of FIGS. 3 to 6 are indicated by similar reference numerals and the description thereof is omitted.

In this embodiment, the gate electrode G is made of a polycide structure similar to the case of FIG. 7, and the transistor is formed to have lightly doped drain (LDD) structure.

In FIG. 9, selective light ion implantation is performed using the laminate of the gate electrode layer 14 and the gate insulating film 12 and the field oxide layer 11 as an implantation mask to form ion implanted regions 18a and 20a for forming the LDD regions. Then, side spacer regions $S_1$ and $S_2$ made, for example, of silicon oxide are formed on the both side surfaces of the gate electrode G by the conventional method (chemical vapor deposition of an oxide layer followed by reactive ion etching). Then, further selective ion implantation is done utilizing the gate laminate G, the side spacers $S_1$ and $S_2$ and the field oxide layers 11 as an implantation mask to form ion implanted regions 18A and 20A for forming an $n^+$-type source and an $n^+$-type drain.

Then, a resist mask 22 is formed on the substrate surface, and an aperture 22H is formed in the resist layer by exposure and development. The aperture 22H exposes some gate electrode G and adjacent regions.

As shown in FIG. 10, selective etching is performed utilizing the gate electrode laminate formed of the gate electrode layer 14 and the gate insulating film 12, and the resist mask 22 as an etching mask, to remove the side spacers $S_1$ and $S_2$ and to form cut-off trenches 24 and 26 in the substrate surface, by dry etching using $CHF_3/O_2$ as the etchant. The trenches have two-step structures adjacent to the gate electrode. Then, boron ions $B^+$ are selectively implanted into the substrate surface using the gate electrode G and the resist mask 22 as an implantation mask to form ion implanted regions 28A and 30A at the bottom of the trenches 24 and 26.

As shown in FIG. 11, the resist mask 22 is removed. Then, an interlayer insulating film 32 is formed on the substrate surface similar to the case of FIG. 6. Then, thermal treatment is performed for activating the implanted ions to provide $n_+$-type source and drain regions 18 and 20 corresponding to the ion implanted regions 18A and 20A, and p-type cut-off regions 28 and 30 corresponding to the ion implanted regions 28A and 30A. In this case, the ion implanted regions 18a and 20a remaining beside the gate electrode are compensated and converted into p-type.

In the above embodiments, it is not necessary to make the depth of the cut-off trenches 24 and 26 deeper than the depth of the ion implanted regions 18A and 20A. Only such surface portion of high impurity concentration in the ion implanted regions 18A and 20A may be removed so that the ion implanted regions 28A and 30A can produce p-type regions.

Although cut-off trenches 24 and 26 are formed on the both sides of the gate electrode G and cut-off regions 28 and 30 are formed in the bottom surface of the both trenches, these cut-off trenches and cut-off regions may not be formed on the both sides of the gate electrode, but may be formed only on one side of the gate electrode G, i.e. on the source side or on the drain side.

Although description has been made along the preferred embodiments of the present invention, the present invention is not limited thereto. It will be apparent for those skilled in the art that various changes, substitutions, alterations, modifications, and combinations can be made within the scope and the spirit of the appended claims.

I claim:

1. A method of manufacturing a masked read-only memory (ROM) device comprising the steps of:

forming a field oxide region of a mesh shape on a semiconductor substrate region of a first conductivity type to surround and define a multiplicity of active regions in said substrate region;

forming a plurality of insulated gate structures for insulated gate field effect transistor, extending across said active regions;

implanting ions of an impurity of a second conductivity type opposite to said first conductivity type into said active regions utilizing said field oxide region and said insulated gate structures as an implantation mask, to form first ion-implanted regions which serve as source/drain regions of said transistors;

covering some active regions and those portions of other active regions remote from the insulated gate structures with a resist mask and exposing portions of said active regions;

etching exposed portions of said active regions utilizing said insulated gate structures and the resist mask as an etching mask, to remove implanted impurity of said second conductivity type and to form trenches which cross current paths of said transistors;

implanting ions of an impurity of said first conductivity type into said active regions at the bottom of said trenches utilizing said insulated gate structures and the resist mask as an implantation mask, to form second ion-implanted regions of the first conductivity type at the bottom of said trenches;

removing said resist mask; and subjecting the semiconductor substrate region to a thermal treatment to activate the implanted impurities, thereby forming current blocking regions of said first conductivity type cutting across said current paths of said second conductivity type.

2. A method of manufacturing a masked ROM device according to claim 1, wherein said etching step removes a surface portion of the active region in said exposed portions, which surface portion includes a region of a maximum impurity concentration of said second conductivity type.

3. A method of manufacturing a masked ROM device according to claim 1, wherein said step of forming a plurality of insulated gate structures includes sub-steps of:

forming a conductive gate electrode layer on a gate insulating film; and patterning said conductive gate electrode layer and said gate insulating layer.

4. A method of manufacturing a masked ROM device according to claim 3, wherein said sub-step of forming a conductive gate electrode layer includes depositing a polycrystalline silicon layer on the gate insulating film, said polycrystalline silicon layer having exposed surfaces, and said step of forming a plurality of insulated gate structures further includes a step of oxidizing exposed surfaces of said polycrystalline silicon layer, after said patterning said conductive gate electrode layer.

5. A method of manufacturing a masked ROM device according to claim 3, wherein said sub-step of forming a conductive gate electrode layer includes:

depositing a polycrystalline silicon layer on the gate insulating film, and depositing a silicide layer on the polycrystalline silicon layer, to form a polycide structure.

6. A method of manufacturing a masked ROM device according to claim 3, wherein said step of forming a plurality of insulated gate structures includes, after said patterning step, the sub-steps of:

depositing an insulator layer over the patterned conductive gate electrode layer; and directionally etching said insulator layer to leave the insulator layer only on side surfaces of said patterned conductive gate electrode layer.

7. A method for manufacturing a semiconductor device, comprising the steps of:

(a) providing a semiconductor substrate having a control electrode of a transistor thereon;

(b) forming a first conductive region of a first conductivity type in the semiconductor substrate adjacent to said control electrode, defining a current path;

(c) removing part of said first conductive region, and forming a trench adjacent to the electrode and crossing the current path; and (d) forming a second conductive region of a second conductivity type opposite to the first conductivity type in the substrate under the trench to provide an electrical junction between the first conductive region and the second conductive region to provide a device element having a cut-off current path.

8. A method according to claim 7, wherein the step (c) further comprising the step of:

(c-1) removing a part of the first conductive region to form the trench.

9. A method according to claim 7, wherein the step (d) further comprising:

(d-1) annealing the substrate to form a p-n junction between the first conductive region and the second conductive region.

10. A method according to claim 7, wherein the first conductivity type is n-type and the second conductivity type is p-type.

11. A method according to claim 7, wherein the electrode has side spacers at sides thereof.

12. A method according to claim 11, further comprising the step of;

(c-1) removing the side spacers during forming the trench.

13. A method according to claim 7, wherein the semiconductor device is a NOR masked read only memory.

14. A method according to claim 7, wherein the second conductive region is formed in a bottom of the trench.

15. A method according to claim 7, wherein the device element is an enhancement field effect transistor.

16. A method for manufacturing a masked read only memory (ROM) having a first type of device element and a second type of device element, comprising the steps of:

(a) providing a semiconductor substrate having a plurality of device regions each of which having a control electrode thereon;

(b) forming a first conductive regions of a first conductivity type in the plurality of device regions, defining a current path in each of the device regions;

(c) selectively forming trench regions in device regions so as to remove part of said first conductivity regions, the trench regions located adjacent to said control electrodes in the device regions crossing the current path; and (d) forming a second conductive region of a second conductivity type opposite to the first conductivity type in the substrate under a bottom of each of the trench regions crossing the current path to provide an electrical junction between the first conductive region and the second conductive region.

17. A method according to claim 16, wherein the second type of device elements are formed in the device regions, the first type of device elements are formed in remaining regions.

18. A method according to claim 17, wherein the first type of device elements are enhancement field effect transistors having low threshold values and the second type of device elements are enhancement field effect transistors having high threshold values.

19. A method according to claim 16, wherein the step (c) further comprising the step of:

(c-1) removing a part of the first conductive region to form the trench.

20. A method according to claim 16, wherein the step (d) further comprising:

(d-1) annealing the substrate to form a p-n junction between the first conductive region and the second conductive region.

21. A method according to claim 16, wherein the first conductivity type is n-type and the second conductivity type is p-type.

22. A method for manufacturing a semiconductor device, comprising the steps of:

(a) providing a semiconductor substrate having a control electrode of a transistor thereon, the electrode has side spacers at sides thereof;

(b) forming a first conductive region of a first conductivity type in the semiconductor substrate adjacent to said control electrode, defining a current path;

(c) forming a trench adjacent to the electrode while removing part of said first conductivity region and crossing the current path;

(d) removing the side spacers during forming the trench; and (e) forming a second conductive region of a second conductivity type opposite to the first conductivity type in the substrate under a bottom of the trench to provide an electrical junction between the first conductive region and the second conductive region and to provide a device element having a cut-off current path.

* * * * *